United States Patent [19]

Malhi et al.

[11] Patent Number: 4,641,173
[45] Date of Patent: Feb. 3, 1987

[54] INTEGRATED CIRCUIT LOAD DEVICE

[75] Inventors: Satwinder Malhi, Garland; David A. Baglee, Houston, both of Tex.

[73] Assignee: Texas Instruments Incorporated, Dallas, Tex.

[21] Appl. No.: 799,890

[22] Filed: Nov. 20, 1985

[51] Int. Cl.[4] ............ H01L 27/12; H01L 49/02; H01L 29/78; H01L 27/02
[52] U.S. Cl. .......................... 357/51; 357/4; 357/6; 357/23.1; 357/41; 357/58; 357/59
[58] Field of Search ............ 357/41, 51, 4, 6, 23.1, 357/58, 59

[56] References Cited

U.S. PATENT DOCUMENTS

| | | | |
|---|---|---|---|
| 4,212,020 | 8/1980 | Yariv et al. | 357/4 |
| 4,403,239 | 9/1983 | Yamazaki | 357/6 |
| 4,502,208 | 3/1985 | McPherson | 357/46 |

FOREIGN PATENT DOCUMENTS 55-83256  7/1980  Japan ....................... 357/51

*Primary Examiner*—J. Carroll
*Attorney, Agent, or Firm*—Douglas A. Sorensen; Robert Groover; James T. Comfort

[57] ABSTRACT

One embodiment of the present invention provides a polycrystalline silicon loading device occupying a minimum of surface area in an integrated circuit. A very thin layer of silicon nitride is formed on the surface of a heavily doped contact point in the integrated circuit. An undoped layer of polycrystalline silicon is then formed on the surface of this thin layer of silicon nitride. A thin layer of silicon nitride is then formed on the surface of the undoped polycrystalline silicon layer. Finally a heavily doped polycrystalline silicon layer for making contact to the loading device is formed on the surface of the second thin silicon nitride layer. Because the two thin silicon nitride layers are very thin, tunneling current through the silicon nitride layers begins at a fairly low threshold level. After tunneling occurs, the main resistance element of the load device is the undoped polycrystalline silicon. The silicon nitride layers prevent the diffusion of dopants into the undoped polycrystalline silicon layer thereby maintaining the integrity of the resistive characteristics of the undoped polycrystalline silicon. Using this technique a load approximately 1 micron squared using present lithographic techniques may be fabricated.

21 Claims, 10 Drawing Figures

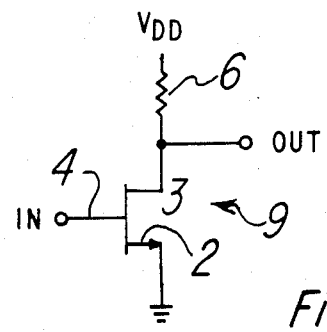
Fig./ PRIOR ART
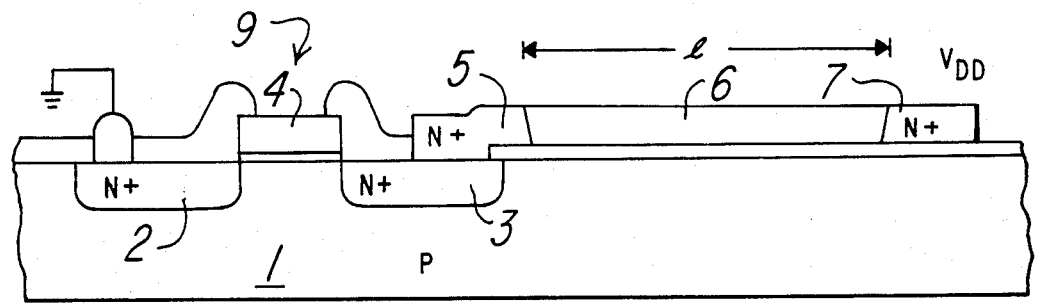
Fig.2 PRIOR ART
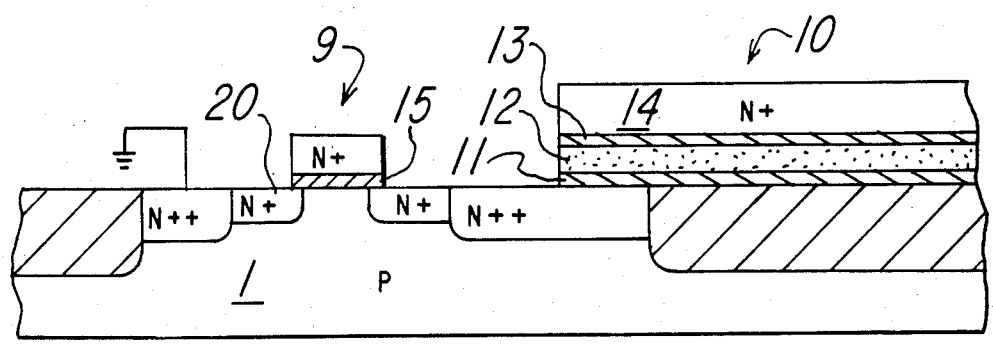
Fig.3
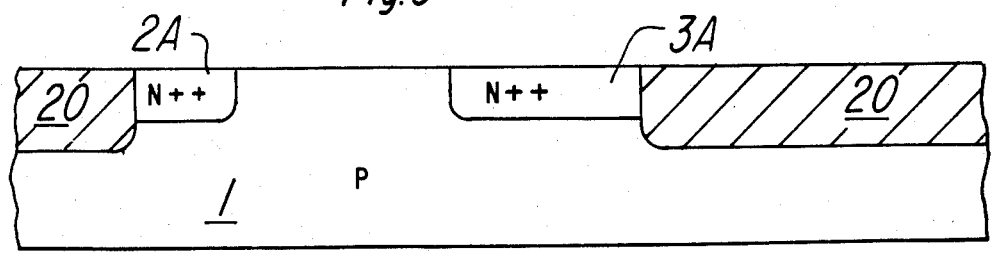
Fig.4a

INTEGRATED CIRCUIT LOAD DEVICE

FIELD OF THE INVENTION

The present invention relates to the field of integrated circuit fabrication. More specifically, the present invention relates to the field of resistive load technology in integrated circuit technology.

BACKGROUND OF THE INVENTION

A common goal in the design of integrated circuits is a reduction of components size to increase component packing density. One component that occupies a particularly large surface area of the integrated circuit in many integrated circuits is the resistor. FIG. 1 is a schematic diagram of the prior art NMOS inverter which requires resistor 6 as a current limiting device. FIG. 2 is a common integrated circuit implementation of the circuit of FIG. 1. Undoped polysilicon resistor 6 provides the appropriate resistance for the circuit. N− end regions 5 and 7 provide good contact points for making ohmic contact to resistor 6. Field effect transistor 9 is a common MOS field effect transistor. The length 1 of resistor 6 must be certain distance in order to provide the appropriate resistance and to avoid the cross diffusion of dopant ions from N− regions 5 and 7 thereby shorting out the resistor. In many circuits length 1 is many times the size of transistor 9. It is an object of the present invention to provide a loading device which occupies a far smaller surface area on the integrated circuit.

SUMMARY OF THE INVENTION

One embodiment of the present invention provides a polycrystalline silicon loading device occupying a minimum of surface area in an integrated circuit. A very thin layer of silicon nitride is formed on the surface of a heavily doped contact point in the integrated circuit. An undoped layer of polycrystalline silicon is then formed on the surface of this thin layer of silicon nitride. A thin layer of silicon nitride is then formed on the surface of the undoped polycrystalline silicon layer. Finally a heavily doped polycrystalline silicon layer for making contact to the loading device is formed on the surface of the second thin silicon nitride layer. Because the two silicon nitride layers are very thin, tunneling current through the nitride layers begins at a fairly low threshold level. After tunneling occurs, the main resistance element of the loading device is the undoped polycrystalline silicon. The silicon nitride layers prevent the diffusion of dopants into the undoped polycrystalline silicon layer, thereby maintaining the integrity of the resistive characteristics of the undoped polycrystalline silicon. Using this technique a load having an area of approximately 1 square micron, using present lithographic techniques, may be fabricated.

DESCRIPTION OF THE DRAWING

FIG. 1 is a schematic diagram of a prior art NMOS inverter;

FIG. 2 is a side view schematic diagram of the structure of an integrated circuit device implementing the circuit of FIG. 1;

FIG. 3 is a side view schematic diagram depicting one embodiment of the present invention;

FIGS. 4A through 4E are side view schematic diagrams depicting the processing steps necessary to fabricate the embodiment shown in FIG. 3.

DETAILED DESCRIPTION

Figure 4B:
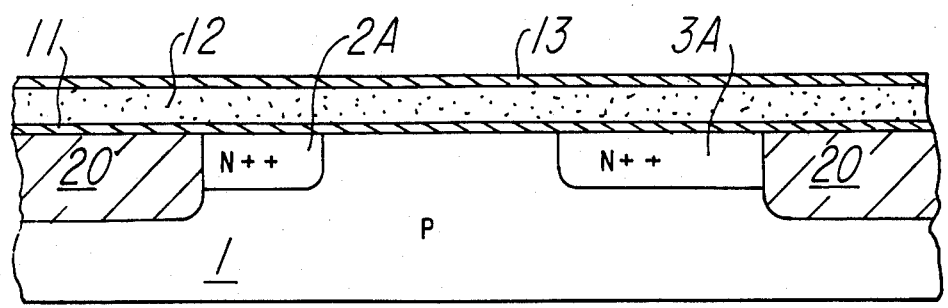

FIG. 3 is side-schematic diagram depicting one embodiment of the present invention implemented with a field effect transistor 9 in order to show the present embodiments operation in an example circuit such as that of FIG. 1. Field effect transistor 9 is fabricated using techniques well known in the art. Integrated load device 10 is fabricated by forming a thin silicon nitride layer 11 having a thickness of approximately 50 angstroms. Undoped polysilicon region 12 having a thickness of approximately 1000 angstroms is formed on the surface of silicon nitride layer 11. Although region 12 is undoped in the described embodiment, region 12 may be doped to any desired doping level to correspond to desired characteristics of the load device. Silicon nitride layer 13 having a thickness of approximately 50 angstroms is formed on the surface of undoped polycrystalline silicon layer 12. N+ doped polycrystalline silicon layer 14 is formed on the surface of silicon nitride layer 13. N+ polycrystalline silicon layer 14 allows for good ohmic contact to other devices in the integrated circuit.

Load 10 operates on the principle of tunneling current through silicon nitride layers 11 and 13 and the behavior of polycrystalline silicon layer 12 as a relatively exponential resistance, below a certain voltage level. With very thin silicon nitride layers, a voltage of greater than a certain threshold voltage causes greatly increased current due to tunneling. Se Sze., S. M., "Current Transport and Maximum Dielectric Strength of Silicon Nitride Films", J. of App. Physics, June 1969. For a deposited silicon nitride layer approximately 50 angstroms thick, this threshold voltage level is approximately 2 volts. This threshold level is reduced by long-term effects of current through the silicon nitride layers so that an older load device such as load device 10 will draw slightly more current. When silicon nitride layers 11 and 13 begin to tunnel, polycrystalline silicon layer 12 becomes the dominant impedance and provides an impedance across which the balance of the voltage applied to the load device is distributed. With a voltage of approximately 5 volts, a current of approximately 1 picoampere is provided by a load device such as load device 10 when constructed according to the teachings of this specification.

The structure of load device 10 is fabricated using the processing steps described with regard to FIG. 4A through 4E. FIG. 4A is a side view schematic diagram depicting the initial processing steps for fabricating one embodiment of the present invention. Field oxide regions 20 are formed using techniques well known in the art. N++ regions 2A and 3A are formed in substrate 1 using either ion implantation or diffusion doping techniques.

Figure 4C:
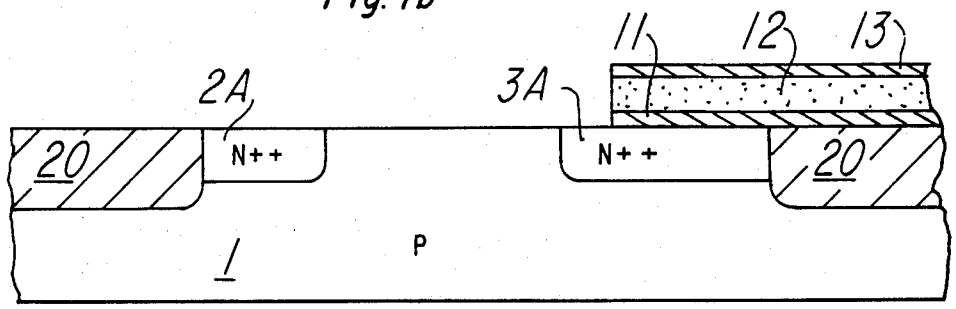
Figure 4D:
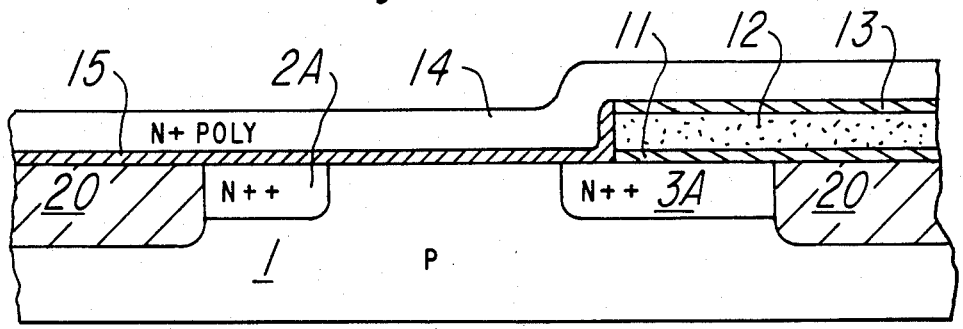
Figure 4E:
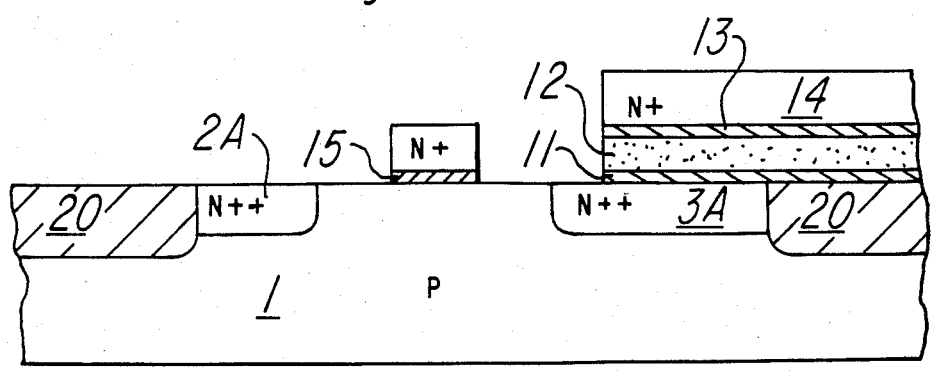

Silicon nitride layer 11, undoped polycrystalline silicon layer 12 and silicon nitride layer 13 are formed on the surface of substrate 1 as shown in FIG. 4B using techniques well known in the art. Silicon nitride layer 11 is approximately 50 angstroms thick and is formed by, for example, chemical vapor deposition. Undoped polycrystalline silicon layer 12 is approximately 1000 angstroms thick and is formed by, for example, chemical vapor deposition. Silicon nitride layer 12 is approximately 50 angstroms thick and is formed by, for example, chemical vapor deposition. Layers 11, 12 and 13 are then patterned and etched using wet or dry etching techniques well known in the art as shown in FIG. 4C; for example, plasma etching may be used. The structure of FIG. 4C is then subjected to a thermal oxidation in an oxygen ambient for approximately 30 minutes at approximately 1000 degrees C. to form silicon dioxide layer 15 as shown in FIG. 4D. N+ doped polycrystalline silicon layer 14 is then formed on the surface of silicon dioxide layer 15 and silicon nitride layer 13, as shown in FIG. 4D, using chemical vapor deposition techniques. Layers 11 through 15 are then patterned using common photolithographic techniques and etched using wet or dry etching processes to form the structure shown in FIG. 4E; for example, plasma etching may be used. N+ regions 2B and 3B are then implanted into substrate 1 to form the structure shown in FIG. 3.

Figure 5A:
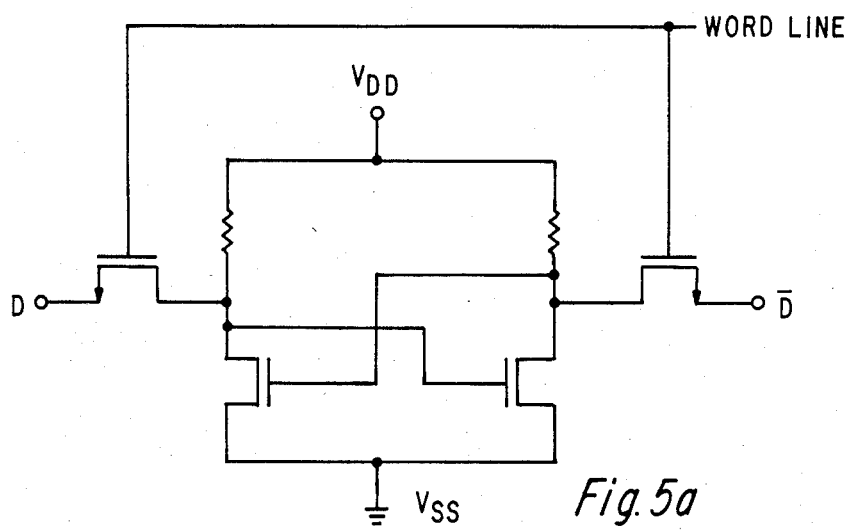
FIGS. 5A and 5B are a schematic diagram and a plan view, respectively, of a static random access memory (SRAM) cell incorporating the embodiment of the invention shown in FIG. 3.
Figure 5B:
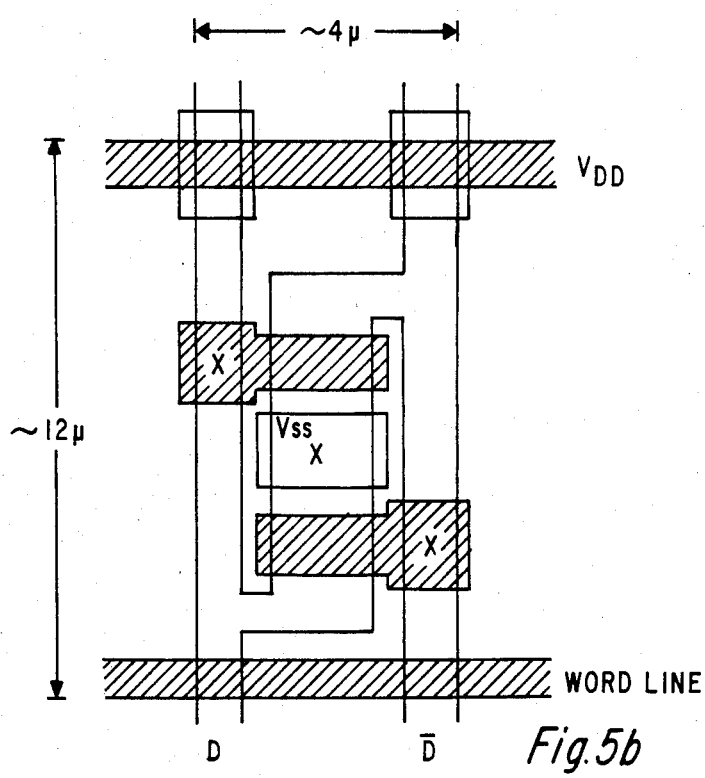

FIGS. 5A and 5B are schematic and plan view diagrams, respectively, of a static random access memory cell which incorporate a load device such as that described with regard to FIG. 3. The layout of the SRAM cell as shown in plan view 5B provides a cell occupying an area of approximately 72 square microns using a patterning process which provides a one micron minimum feature size. This compares with a cell size of approximately 100 square microns using a prior art load device.

Although this description includes specific embodiments of the present invention, it is not to be construed as limiting the scope of the invention. Other embodiments of the present invention will become obvious to those skilled in the art in light of the teachings of this invention. The scope of the invention is limited only by the scope of the following claims.

TECHNICAL ADVANTAGES

The present invention provides a load device for current limiting purposes occupying a much smaller area than the common resistor used for current limiting techniques in the prior art. An SRAM cell, which is a further embodiment of the invention, is described which occupies a much smaller surface area than prior art SRAM cells.

We claim:
1. A resistive load device comprising:
    a first layer of conductive material serving as one terminal of said load device;
    a first layer of insulating material capable of tunneling electrons directly overlying said first layer of conductive material;
    a layer of resistive material overlying said first insulating layer;
    a second layer of insulating material overlying said resistive material;
    a second layer of conductive material overlying said second layer of insulating material, said second layer of conductive material being connected to serve as another terminal of said resistive load device;
    wherein, at voltages above the tunneling threshold of said first layer of insulating material, the resistance of said layer of resistive material dominates the resistance of said first layer of insulating material.
2. A resistive load device as in claim 1, wherein said first and second layers of insulating material comprise silicon nitride.
3. A resistive load device comprising:
    a first layer of insulating material capable of tunneling electrons;
    a layer of resistive material formed adjacent to said first insulating layer;
    a second layer of said insulating material formed adjacent to said resistive material oppositely disposed from said first layer of insulating material;
    a first terminal connected to said first layer; and
    a second terminal connected to said second layer;
    wherein, at voltages above the tunneling threshold of said first layer of insulating material, the resistance of said layer of resistive material dominates the resistance of said first layer of insulating material.
4. A resistive load device comprising:
    a first layer of insulating material capable of tunneling electrons;
    a layer of resistive material formed adjacent to said first insulating layer;
    a second layer of said insulating material formed adjacent to said resistive material oppositely disposed from said first layer of insulating material;
    a first terminal connected to said first layer and oppositely disposed from said resistive material; and
    a second terminal connected to said second layer and oppositely disposed from said resistive material;
    wherein, at voltages above the tunneling threshold of said first layer of insulating material, the resistance of said layer of resistive material dominates the resistance of said first layer of insulating material.
5. A resistive load as in claim 1 wherein said insulating material is silicon nitride.
6. A resistive load as in claim 1 wherein said resistive material is polycrystalline silicon.
7. An integrated circuit having a resistive load device comprising:
    a first layer of insulating material capable of tunneling electrons;
    a layer of resistive material formed adjacent to said first insulating layer;
    a second layer of said insulating material formed adjacent to said resistive material oppositely disposed from said first layer of insulating material;
    a first terminal connected to said first layer and oppositely disposed from said resistive material; and
    a second terminal connected to said second layer and oppositely disposed from said resistive material;
    wherein, at voltages above the tunneling threshold of said first layer of insulating material, the resistance of said layer of resistive material dominates the resistance of said first layer of insulating material.
8. An integrated circuit as in claim 4 wherein said insulating material is silicon nitride.
9. An integrated circuit as in claim 4 wherein said resistive material is polycrystalline silicon.
10. A resistive load device comprising:
    a first layer of silicon nitride;
    a layer of polycrystalline silicon formed adjacent to said first insulating layer;
    a second layer of said silicon nitride adjacent to said polycrystalline silicon oppositely disposed from said first layer of insulating material;
    a first terminal connected to said first layer and oppositely disposed from said layer of polycrystalline silicon; and a second terminal connected to said second layer and oppositely disposed from said layer of polycrystalline silicon;

wherein, at voltages above the tunneling threshold of said first layer of insulating material, the resistance of said layer of resistive material dominates the resistance of said first layer of insulating material.

11. An integrated circuit having a resistive load device comprising:

a first layer of silicon nitride;

a layer of polycrystalline silicon formed adjacent to said first insulating layer;

a second layer of said silicon nitride adjacent to said polycrystalline silicon oppositely disposed from said first layer of insulating material;

a first terminal connected to said first layer and oppositely disposed from said layer of polycrystalline silicon; and a second terminal connected to said second layer and oppositely disposed from said layer of polycrystalline silicon;

wherein, at voltages above the tunneling threshold of said first layer of insulating material, the resistance of said layer of resistive material dominates the resistance of said first layer of insulating material.

12. A static random access memory cell comprising:
first and second cross coupled transistors;
first and second load devices regulating the current flow through said transistors, each load device including:

(a) a first layer of insulating material capable of tunneling electrons;

(b) a layer of resistive material formed adjacent to said first insulating layer; and (c) a second layer of said insulating material formed adjacent to said resistive material oppositely disposed from said first layer of insulating material;

(d) wherein, at voltages above the tunneling threshold of said first layer of insulating material, the resistance of said layer of resistive material dominates the resistance of said first layer of insulating material.

13. The device of claim 7, wherein said second layer of insulating material is also capable of tunneling electrons.

14. The device of claim 7, wherein said second layer of insulating material has substantially the same composition as said first layer of insulating material.

15. The device of claim 7, wherein said first layer of insulating material is capable of tunneling electrons at a tunneling threshold voltage level of approximately 2 volts or less.

16. The device of claim 7, wherein said first layer of insulating material is less than 100 Angstroms thick.

17. The device of claim 7, wherein said second layer of insulating material is less than 100 Angstroms thick.

18. The device of claim 6, wherein said polycrystalline silicon is substantially intrinsic.

19. The device of claim 6, wherein said polycrystalline silicon is substantially intrinsic, and said first layer of insulating material comprises a diffusion barrier.

20. The device of claim 1, wherein said first layer of conductive material comprises doped silicon.

21. The device of claim 6, wherein said polycrystalline silicon is substantially intrinsic, and said first layer of insulating material comprises a diffusion barrier, and said first layer of conductive material comprises doped silicon.

* * * * *